United States Patent [19]
Cox et al.

[11] Patent Number: 6,135,782
[45] Date of Patent: Oct. 24, 2000

[54] ELECTRICAL COMPRESSION CONNECTOR FOR A DISC DRIVE

[75] Inventors: Alvin E. Cox, Yukon; Housan Dakroub, Oklahoma City, both of Okla.

[73] Assignee: Seagate Technology, Inc., Scotts Valley, Calif.

[21] Appl. No.: 09/302,640

[22] Filed: Apr. 30, 1999

Related U.S. Application Data

[60] Provisional application No. 60/088,072, Jun. 5, 1998, and provisional application No. 60/089,347, Jun. 15, 1998.

[51] Int. Cl.[7] .................................................. H01R 12/00
[52] U.S. Cl. .............................................................. 439/65
[58] Field of Search ................................ 439/65, 67, 77, 439/79

[56] References Cited

U.S. PATENT DOCUMENTS

| | | | |
|---|---|---|---|
| 3,715,706 | 2/1973 | Michel et al. | 439/65 |
| 4,509,811 | 4/1985 | Amano et al. | 439/77 |
| 4,695,108 | 9/1987 | Ichitsubo | 439/77 |
| 4,752,244 | 6/1988 | Kuhl et al. | 439/635 |
| 4,752,246 | 6/1988 | Triner et al. | 439/682 |
| 4,755,147 | 7/1988 | Young | 439/77 |
| 5,357,386 | 10/1994 | Haidari et al. | 439/77 |
| 5,403,202 | 4/1995 | Roehling | 439/493 |
| 5,541,788 | 7/1996 | Ishida et al. | 439/67 |
| 5,655,285 | 8/1997 | Bonn et al. | 439/67 |

*Primary Examiner*—T. C. Patel
*Attorney, Agent, or Firm*—Crowe & Dunlevy

[57] ABSTRACT

A low inductance electrical compression connector for a disc drive interconnecting conductors of a flex circuit to conductive traces on a PCB, the electrical compression connector having a dielectric housing with a plurality of spaced apart insulator portions and conductive compression contacts disposed between the insulator portions. The insulator portions, the dielectric housing and the conductive compression contacts form open ended deflection cavities disposable above the PCB. First ends of the conductive compression contacts and solderable to conductive traces on the PCB, while second ends of the conductive compression contacts are pre-load spring contacts disposable above respective deflection cavities. Inserting the conductors of the flex circuit beneath the pre-load spring contacts into the deflection cavities causes the pre-load spring contacts to engage the conductors of the flex circuit to secure the flex circuit against the printed circuit while providing electrical contact.

16 Claims, 4 Drawing Sheets

ELECTRICAL COMPRESSION CONNECTOR FOR A DISC DRIVE

RELATED APPLICATIONS

This application claims priority to Provisional Application No. 60/088,072 entitled LOW INDUCTANCE FLEX-TO-PCB COMPRESSION CONNECTOR, filed Jun. 5, 1998 and Provisional Application No. 60/089,347 entitled HDA DATA FLEX EXIT SUPPORT AND SEAL, filed Jun. 15, 1998.

FIELD OF THE INVENTION

The present invention relates generally to the field of disc drive data storage devices, and more particularly but not by way of limitation, to a low inductance compression connector for connecting an actuator flex circuit of a disc drive to a printed circuit board.

BACKGROUND OF THE INVENTION

Modern disc drives are commonly used in a multitude of computer environments ranging from super computers through notebook computers to store large amounts of data in a form that can be made readily available to a user. Typically, a disc drive has one or more magnetic discs that are rotated by a spindle motor at a constant high speed. Each disc surface has a data recording surface divided into a series of generally concentric data tracks radially spaced across a band having an inner diameter and an outer diameter.

The data is stored within the data tracks on the disc in the form of magnetic flux transitions. The flux transitions are induced by an array of read/write heads. Typically, each data track is divided into a number of data sectors that store fixed sized data blocks.

The read/write head includes an interactive element such as a magnetic transducer that senses the magnetic transitions on a selected data track to read the data stored on the track. Alternatively, to write data to the disc surface, the read/write head transmits an electrically induced, short duration magnetic field that induces magnetic transitions on the selected data track.

Each read/write head is mounted to a load arm. Each load arm is supported by an actuator arm that is typically one of a plurality of members extending from an actuator cartridge-bearing member of an actuator assembly. The actuator assembly provides the rotary motion needed to selectively position the read/write head over a selected data track of the disc to either read data from or write data to the selected data track. The read/write head includes a slider assembly having an air-bearing surface that responds to an air bearing developed by the interaction of the read/write heads with a boundary layer of air. The boundary layer of air is developed by the rotation of the discs beneath the read/write heads. In response to the air bearing the read/write head flies adjacent the disc surface at a desired height thereby creating a gap between the read/write head and the surface of the corresponding disc.

Typically, a plurality of open-center discs and spacer rings are alternately stacked on a hub of the spindle motor. The hub, defining the core of the stack, serves to align the discs and spacer rings around a common axis. Collectively the discs, spacer rings, clamp ring and spindle motor hub define a disc pack. The read/write heads attached to the actuator assembly accesses the surfaces of the stacked discs.

In addition to the read/write heads the actuator assembly generally includes head wires, which conduct electrical signals from the read/write heads to a flex circuit that, in turn, conducts the electrical signals to a read channel located on the printed circuit board (PCB) of the disc drive. Normally the electrical signal paths are routed through one or more connectors en route to the read/write channel. The connectors facilitate the electrical connection between the flex circuit of the disc drive and the PCB of the disc drive. However in so doing, the contacts of the connectors typically induce an added inductance and capacitance into the circuit thereby causing a change in inductance and capacitance per unit length along the signal path. This change in inductance per unit length along the signal path frequently results in a parasitic electrical degradation of the signal. Several approaches have been used to accommodate the data signal interconnect needs of a disc drive, but in general, these approaches have been silent regarding resolution of parasitic electrical signal degradation problems caused by changes in inductance per unit length along the signal path.

In connecting the flex circuit and the PCB one previous approach makes use of an apparatus with a three connector combination configuration having a flex circuit component; a pass-through connector; and a printed circuit board connector. Under this scheme, the first primary component, the flex circuit connector (the connector body housing female connector pins), is soldered directly to the flex circuit. The second primary component, the pass-through connector having a connector body that houses male pins with a top portion protruding from a top side of the connector body and a bottom portion protruding from a bottom side of the connector body, is disposed adjacent the basedeck with the bottom portions of the male pins extending from an aperture or slot in the basedeck. The third primary component, the printed circuit board connector with a connector body housing female connector pins, is soldered directly onto the PCB. This approach has the advantage of confining the flex circuit internal to the HDA.

Under this three-connector combination approach the flex circuit connector is mounted to a flex circuit mounting bracket. Then the flex circuit connector connects to the pass-through connector internal to the HDA. Contact between the flex circuit connector and the pass-through connector is maintained by physically securing the flex circuit mounting bracket and the pass-through connector to the basedeck of the disc drive. External to the basedeck the pass-through connector connects to the printed circuit board connector. The printed circuit board connector is mounted to the PCB of the disc drive, and the PCB is then fastened to the basedeck of the disc drive. Attaching the disc drive PCB to the basedeck provides the means of maintaining physical contact between the pass-through connector and the printed circuit board connector.

Another approach of connecting a flex circuit to the disc drive PCB is to feed the flex circuit external to the HDA. Under this approach the flex circuit typically passes between the basedeck and a gasket mounted on the cover of the disc drive. Once the flex circuit is external to the HDA, the flex circuit commonly mates with an edge connector that is soldered to the PCB of the disc drive. The disadvantages of this external feed approach are exposure of the flex circuit to handling damage during the assembly process; customer installations, and in automated production processes. The production difficulties tend to arise when trying to locate, secure and connect the non-rigid flex circuit via automated means.

Normally, under this external feed approach, a flex circuit alignment member is secured directly to the flex circuit and a printed circuit board connector (a connector body housing female connector pins) is soldered directly to the PCB. The flex circuit is secured to an alignment member which lends support to the flex circuit and provides a means to maintain registration of the contact pads of the flex circuit in relation to the female connector pins or contact pads of the PCB. Additionally, the flex circuit is connected to the PCB external to the basedeck thereby exposing the flex circuit to potential damage. The PCB is then fastened to the disc drive basedeck to maintain stability of the connection. An example of an adaptation of this approach is disclosed by U.S. Pat. No. 5,403,202 to Donald P. Roehling ("Roehling '202").

As is known, key factors that influence the choice of an interconnection solution to facilitate connection between the flex circuit and the disc drive PCB are quality; space constraints; mass production requirements; component costs; and component performance (for both mechanical and electrical characteristics). In historical perspective, with technology advances in the disc drive industry, one or more factors have dominated the decision process when electing an interconnection solution for a specific disc drive technology advancement. It is evident that the prominent key factor driving the signal interconnection technology invention in Roehling '202 was the space constraint challenges presented by disc drives.

In contrast to the Roehling '202 approach, the three-connector combination approach was driven by the desire to minimize the exposure of the flex circuit to handling and use damage while maximizing the interconnect configuration for automation. Under the three-connector combination approach the flex circuit is confined internal to the HDA of the disc drive, resolving the problem of exposing the flex circuit to handling and environmental damage, while use of the pass-through male pinned connector promotes ease of production.

Advancements in bit transfer rate technologies, with transfer rates in the range of one gigabit per second and the resultant pico-second range rise and fall signal time, have driven the interconnection electrical performance characteristics of the connection itself to be a key factor of read/write signal management. As bit transfer rates rise, negative effects on the integrity of the read/write signal, primarily parasitic electrical signal degradation due to changes in inductance per unit length along the signal path, begin to dominate as the key electrical performance factor to be addressed by read/write signal interconnection technology. As transfer rates approach the gigabit per second range, maintaining uniform inductance along the signal becomes the dominant key factor.

The signal management burdens within read/write signal interconnection technology, brought about by the emergence of transfer rates in the gigabit per second range, coupled with the remaining key factors of quality, mechanical performance, space constraints, automation considerations and component costs, have collectively converged to generate an unmet need in the industry for an improved flex-to-PCB connector that minimizes the parasitic electrical signal degradation effects created by changes in inductance per unit length seen by the read/write signal along the signal path.

SUMMARY OF THE INVENTION

The present invention provides a low inductance electrical compression connector for interconnecting conductors of a flex circuit to conductive traces on a printed circuit board in a disc drive. The electrical compression connector has a dielectric housing with a plurality of spaced apart insulator portions extending from the dielectric housing. The insulator portions and the dielectric housing form open ended deflection cavities with the insulator portions forming the side walls and the dielectric housing forming the end of each deflection cavity. Conductive compression contacts are disposed between the insulator portions and supported by the dielectric housing, the conductive compression contacts having first and second ends extending from the dielectric housing. Each first end is solderable to a respective conductive trace on the printed circuit board while each second end is a pre-load spring contact disposable above a respective one of the deflection cavities.

When the electrical compression connector is attached to the printed circuit board the deflection cavities are disposed above the printed circuit board and when the flex circuit conductors are inserted adjacent the pre-load spring contacts the pre-load spring contacts engage the conductors of the flex circuit to secure the flex circuit while providing the electrical contact between the flex circuit and the printed circuit board.

These and other advantages and features of the present invention will be apparent from the following description when read in conjunction with the drawings and appended claims.

BRIEF DESCRIPTION OF THE DRAWINGS

FIG. 8 is a top view, in partial cut-away detail, of one of the conductive compression contacts of the electrical compression connector of FIG. 6.

DETAILED DESCRIPTION

Figure 1:
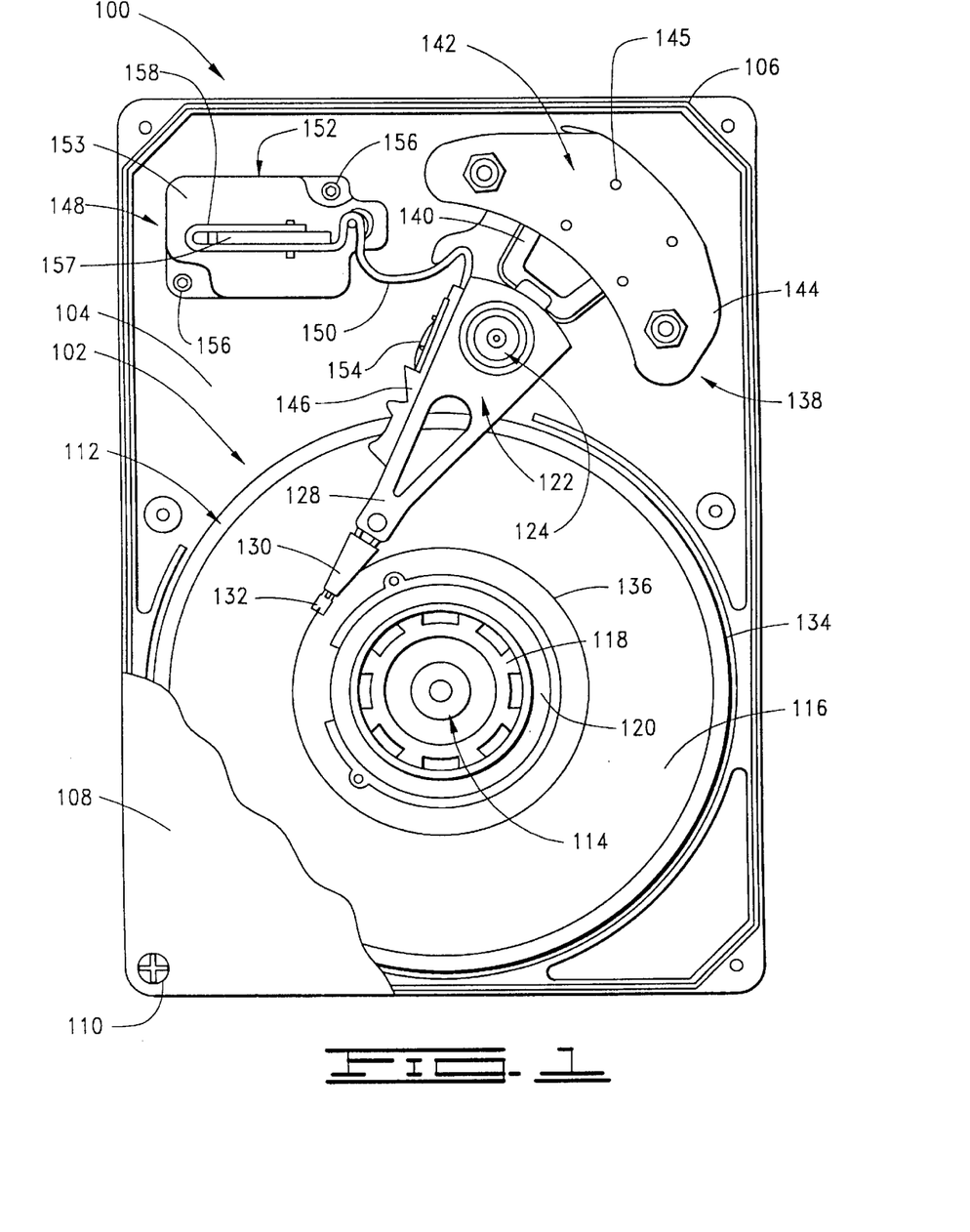
FIG. 1 is a top view of a disc drive constructed in accordance with the present invention, the top cover shown partially removed.

Referring to the drawings in general, and more particularly to FIG. 1, shown therein is a disc drive 100 constructed in accordance with the present invention. The disc drive 100 includes a head disc assembly (HDA) 102, which includes a basedeck 104 to which various disc drive components are mounted; a gasket 106; a top cover 108 (partially cutaway); and fasteners 110. Joined together, the basedeck 104, gasket 106, and top cover 108 form a housing to hermetically seal the internal environment of the HDA 102. It will be understood that numerous details of construction of the disc drive 100 are not included in the following description as such are well known to those skilled in the art and are believed to be unnecessary for the purpose of describing the present invention.

Mounted to the basedeck 104 is a disc pack assembly 112 having a spindle motor assembly 114 with a plurality of alternately stacked discs 116 and disc spacers (not shown) disposed about a spindle motor hub 118 and secured by a clamp ring 120. Adjacent the discs 116 is an actuator assembly 122 which pivots about a cartridge bearing assembly 124. The actuator assembly 122 has a centrally disposed E-block member (not shown) on which a plurality of actuator arms 128 (one shown) are provided. Each actuator arm 128 supports a load arm assembly 130 which in turn supports a read/write head 132, and each read/write head 132 corresponds to a respective surface of one of the discs 116.

Each disc 116 has a data recording surface divided into concentric circular data tracks (not shown), and the read/write heads 132 are positioned adjacent the data tracks to read data from, or write data to, the tracks. The data tracks collectively form a data portion on the disc surface constrained on its outer extremity by a guard band 134, and on its inner extremity by a landing zone 136.

The actuator assembly 122 of the disc drive 100 is pivotally positioned by way of a voice coil motor assembly (VCM) 138. The VCM 138 comprises an actuator coil assembly 140 immersed in the magnetic field generated by a magnet assembly 142. The magnet assembly 142 comprises a pair of opposing magnets (not shown) each supported by a pole piece 144. The pole piece 144, constructed from magnetically permeable material such as steel, provides a flux path to complete the magnetic circuit of the VCM 138. The magnet assembly 142 is mounted to the basedeck 104 and to the top cover 108 via screws and mounting apertures 145 located in the pole piece 144.

When controlled DC current is passed through the actuator coil assembly 140, an electromagnetic field is set up which interacts with the magnetic circuit of the VCM 138 to cause the actuator coil assembly 140 to move relative to the magnet assembly 142 in accordance with the well-known Lorentz relationship.

To provide the requisite electrical conduction paths between the read/write heads 132 and disc drive read/write circuitry (not shown), read/write head wires (not separately shown) are routed on the actuator assembly 122. From the read/write heads 132 the read/write head wires run along the load arm assemblies 130 and actuator arms 128 to a flex stiffener 146 of a flex circuit support and seal apparatus 148. At the flex stiffener 146 the read/write head wires are soldered to corresponding conductive pads of a flex circuit 150 of the flex circuit support and seal apparatus 148. The flex circuit support and seal apparatus 148 comprises the flex circuit 150, a rigid dielectric support bracket 152, a printed circuit board (PCB) 154 and the flex stiffener 146. The flex circuit support and seal apparatus 148 is connected to the basedeck 104 through the use of fasteners 156.

The support bracket 152 has a base portion 153 and a connector portion 157 which extends vertically from the base portion 153. A flex circuit support and seal aperture or slot (not shown) is provided in the basedeck 104, and the connector portion 157 extends therethrough when the fasteners 156 attach the base portion 153 to the basedeck 104 as shown.

Figure 2:
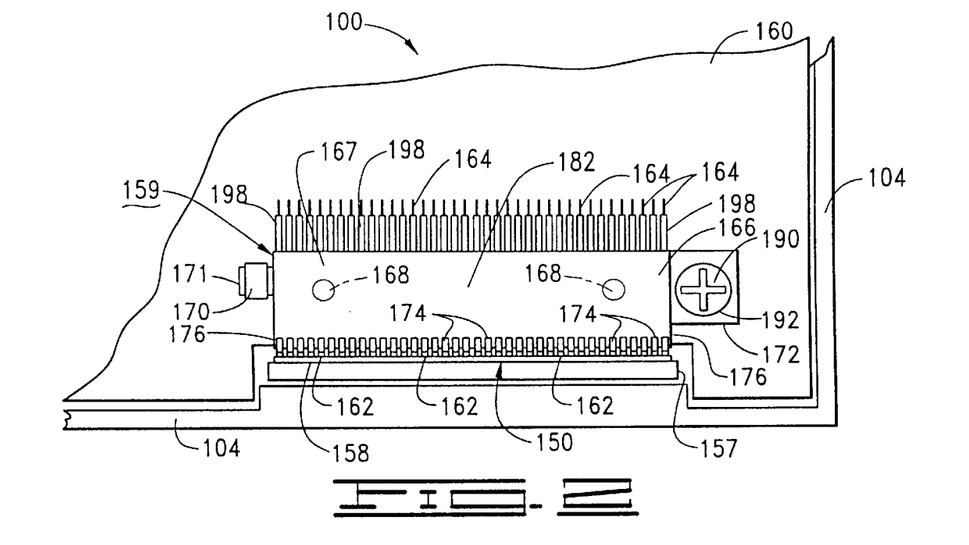
FIG. 2 is a partial bottom view of the disc drive of FIG. 1, with an electrical compression connector mounted to a PCB of the disc drive of FIG. 1.

A conductor portion 158 (also shown in FIG. 7 which will be discussed hereinbelow) of the flex circuit 150 is supported by, and extended through, the flex circuit support and seal aperture (not shown) in the basedeck 104. The conductor portion 158 is disposed to engage a flex-to-PCB electrical compression connector 159 which is mounted to a printed circuit board (PCB) 160 as shown in FIG. 2. The resulting interconnect configuration minimizes the number of interconnections a readback signal sees between the read/write head 132 and a read channel (not shown) of the PCB 160. The PCB 160 provides the disc drive read/write circuitry to control the operation of the read/write heads 132, as well as other interface and control circuitry for the operation of disc drive 100.

In addition to providing the interconnection between the read/write heads 132 and the PCB 160, the flex circuit support and seal apparatus 148 provides a bottom portion of the hermetically sealed internal environment for the HDA 102.

Figure 3:
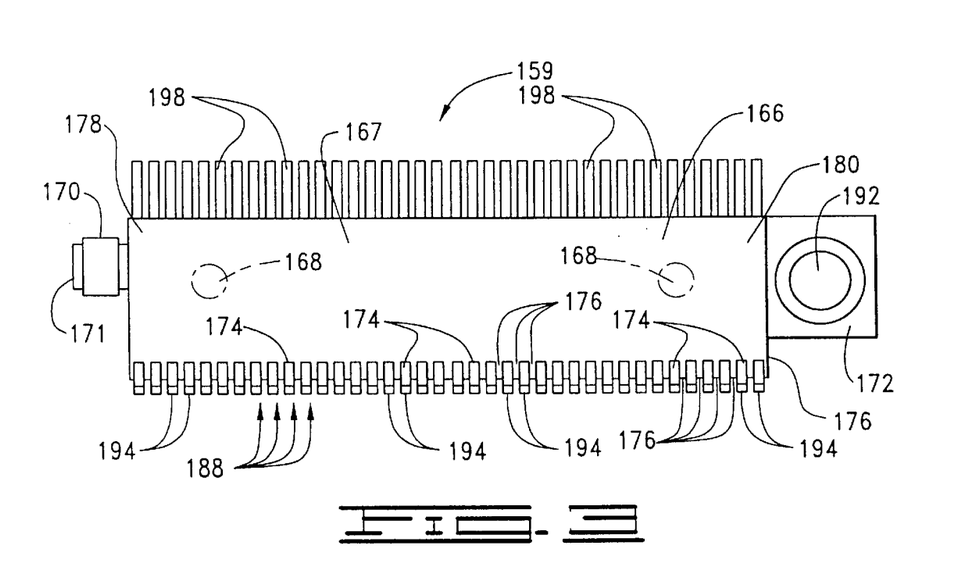
FIG. 3 is an enlarged view of the electrical compression connector of FIG. 2.

FIG. 2 shows the flex-to-PCB electrical compression connector 159 mounted on the PCB 160 for conductors 162 of the flex circuit 150 to conductive traces 164 on the PCB 160, and FIG. 3 provides an enlarged view of the electrical compression connector 159. The electrical compression connector 159 comprises a dielectric housing 166 having a housing body 167; a pair of alignment pegs 168 extending from the dielectric housing 166; an attachment member 170 surrounding and securing an attachment tab 171, the attachment tab 171 extending from one end of the dielectric housing 166; a support tab 172 attached to the other end of the dielectric housing 166; a plurality of conductive compression contacts 174 supported by the dielectric housing 166; and a plurality of spaced apart disposed L-shaped insulators 176 (also referred to herein as "insulator portions") extending from the housing body 167.

Figure 4:
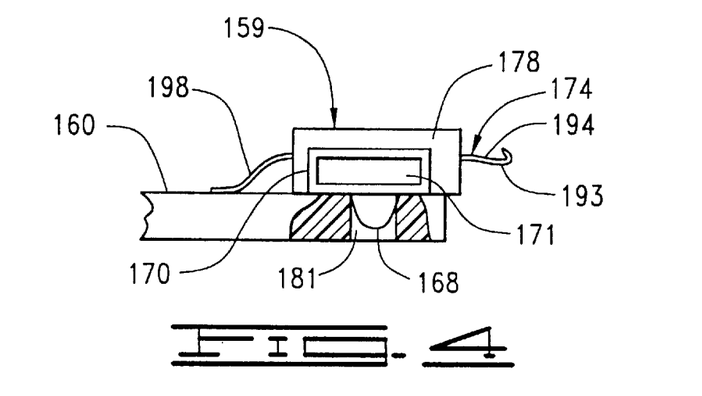
FIG. 4 is a partially cut-away view of one end of the electrical compression connector and PCB of FIG. 2.
Figure 5:
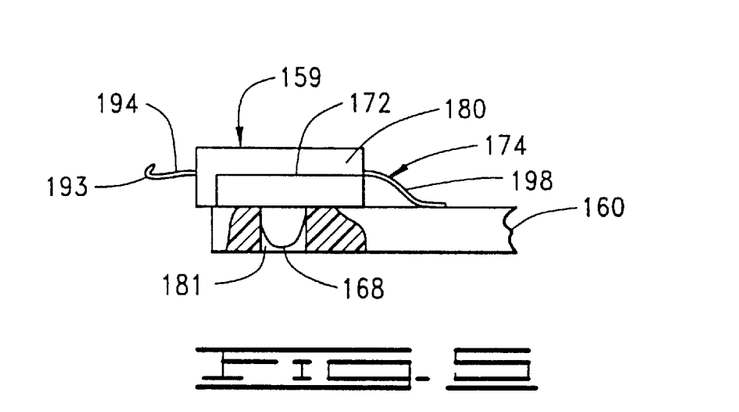
FIG. 5 is a partial cut-away view of the opposing end of the electrical compression connector and PCB of FIG. 4.

FIG. 4 is a partially cut-away view of the electrical compression connector 159 at its first end 178, while FIG. 5 is a similar view of the electrical compression connector 159 at its second end 180. Each of these figures shows one of the alignment pegs 168 disposed in an appropriately dimensioned alignment aperture 181 in the PCB 160, and shows the spatial disposition of the conductive compressive contacts 174 relative to the surface of the PCB 160.

Figure 6:
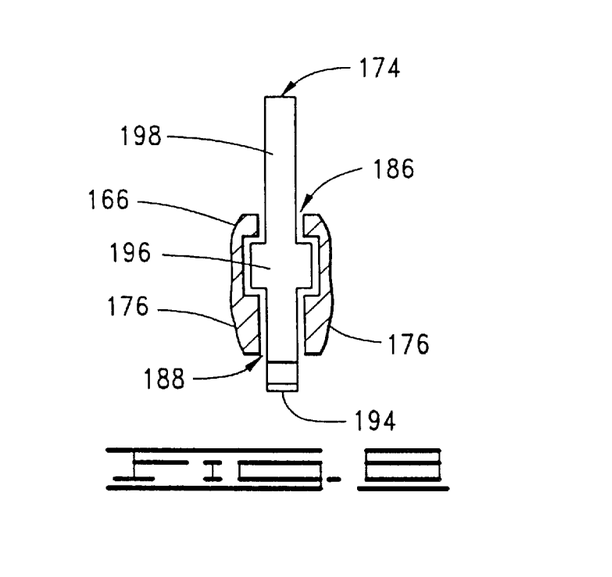
FIG. 6 is a partial cross-sectional view of the electrical compression connector and PCB of FIG. 1.

FIG. 6 is a partial cross-sectional view of the electrical compression connector 159 and reveals that the dielectric housing 166 has a top portion 182, a bottom portion 184, a plurality of stepped conductive compression contact mounting channels 186 (one shown), and a plurality of deflection cavities 188 (one shown) disposed between the insulators 176. It will be noted that the top and bottom portions 182, 184 (also referred to as first and second portions) cooperate to form the housing body portion 167 of the dielectric housing 166.

The PCB 160 has an attachment pad (not shown) to provide a soldering surface for attaching the electrical compression connector 159 to the PCB 160. The attachment tab 171 (FIG. 3) is used for soldering the electrical compression connector 159 to the attachment pad of the PCB 160, while the support tab 172 is used in securing the electrical compression connector 159 as well as the PCB 160 to the basedeck 104 by means of a mounting screw 190 (FIG. 2) which passes through a support tab aperture 192 to engage axially aligned mounting apertures (not shown) in the PCB 160 and containment members (not shown) in the basedeck 104 of disc drive 100.

Figure 7:
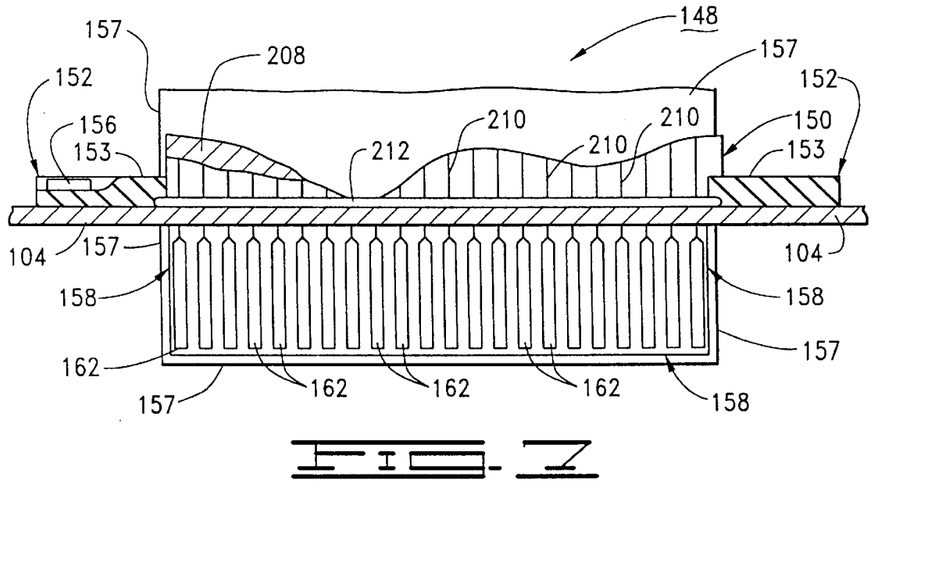
FIG. 7 is a partial cut-away, enlarged view of the flex circuit support and seal apparatus with an attached flex circuit of FIG. 1.

FIG. 7 shows an enlarged view of the flex circuit 150 and its attached conductors 162. The conductor portion 158 of the flex circuit 150 wraps around the vertically extending connector portion 157 of the support bracket 152, and the conductors 162 and conductor portion 158 attached to the connector portion 157 and together extend from the internal portion of the disc drive 100 through the basedeck 104.

The conductors 162 are inserted adjacent the deflection cavities 188 of the dielectric housing 166 of the electrical compression connector 159 and come to rest in electrical contact with a conductive surface 193 (FIG. 6) of a pre-load spring contact 194 of the conductive compression contacts 174. The pre-load spring contact 194 of each conductive compression contact 174 is in seamless connection with a main body portion 196 of the conductive compression contact 174. The main body-portion 196 of each conductive compression contact 174 is, in turn, in seamless connection with a tail portion 198 of each conductive compression contact 174.

To complete the electrical connection between the flex circuit 150 and the PCB 160, the tail portions 198 of the conductive compression contacts 174 are soldered to respective conductive traces 164 of the PCB 160 (FIG. 2). In addition to supporting the electrical compression connector 159, the PCB 160 also supports an input/output device connector (not shown) used to interface disc drive 100 with a computing device (not shown).

FIG. 6 illustrates the relative relationship between the primary elements of the flex-to-PCB electrical compression connector 159. The dielectric housing 166 provides the deflection cavities 188 for accommodating the deflection of the conductive compression contacts 174 during mating of the HDA 102 with the PCB 160. The deflection cavities 188 are disposed between adjacent insulators 176 and beneath the pre-load spring contact 194 of the conductive compression contacts 174. The conductors 162 of the flex circuit 150 are urged by the conductive compression contacts 174 against the connector portion 157 of the support bracket 152 thereby providing the mechanical means of securing the flex circuit 150 relative to the electrical connection. In the mounted position, the conductors 162 of the flex circuit 150 form an electrical connection with the conductive surface 193 of the conductive compression contacts 174.

The alignment pegs 168, extending from a bottom external surface 202 of the dielectric housing 166, communicate with the alignment apertures 181 to align the dielectric housing 166 on the PCB 160 during the assembly operation. As discussed above, the mounting screw 190 extends through the support tab 172 secures the electrical compression connector 159 and the PCB 160 to the basedeck 104, and the attachment member 170 that encompasses and secures attachment tab 171 is soldered to the attachment pad (not shown) of the PCB 160 to secure the electrical compression connector 159 to the PCB 160.

As best shown in FIGS. 3 and 6, the insulators 176 are disposed between the conductive compression contacts 174 and prevent shorting of adjacent conductive compression contacts 174. Preferably, an upstanding portion 204 of each of the insulators 176 has a width of substantially one half the width of the pre-load spring contact 194 of the conductive compression contact 174, and a height of about eight times the width of the upstanding portion 204. Further, each upstanding portion 204 preferably has a depth of about one half the height of the upstanding portion 204. A base portion 206 of each of the insulators 176 preferably has a width substantially equal to the width of the upstanding portion 204 of the insulators 176. The base portion 206 of the insulators 176 has a height of substantially four times the width of the of the base portion 206 of the insulators 176. The base portion 206 further has a length substantially equal to the height of the base portion 206 of the insulators 176.

Turning to FIG. 7, shown therein is the flex circuit support and seal apparatus 148 with its support bracket 152 affixed with the flex circuit 150. The partial cut-away view of flex circuit 150 exposes a semi-flexible, deformable resilient dielectric stiffener portion 208 that provides rigidity for the flex circuit 150 and the conductors 162 needed to support the spring force developed by the pre-load spring contact 194 of the conductive compression contacts 174. A plurality of conductive traces 210 disposed on the flex circuit 150 serve to electrically connect the conductors 162 to the read/write head 132 via read/write head wires (not shown). First ends of the read/write head wires are soldered to the read/write head 132 and opposing second ends of the read/write head wires are soldered to conductive pads (not shown) of the flex circuit 150. The conductor portion 158 of the flex circuit 150 is supported by the connector portion 157 of the rigid dielectric support bracket 152 and together pass through the basedeck 104, as discussed above.

As also disclosed above, the conductors 162 and the conductor portion 158 of the flex circuit 150 together with the connector portion 157 of the support bracket 152 extend from the internal portion of the disc drive 100 through the basedeck 104. When aligned, the conductors 162 are inserted adjacent the deflection cavities 188 (FIG. 6) of the dielectric housing 166 of the electrical compression connector 159 and come to rest in electrical contact with the conductive surfaces 193 of the pre-load contact spring 194 of the conductive compression contacts 174.

The conductors 162 of the flex circuit 150 form an electrical connection with the pre-load spring contact 194 of the conductive compression contacts 174. In addition to providing electrical connection between the flex circuit 150 and the PCB 160, the conductive compression contacts 174 develop a spring force that urge the conductors 162 of the flex circuit 150 against connector portion 157 the PCB 160 thereby providing the mechanical means of securing the flex circuit 150 relative to the electrical connection to the electrical compression connector 159.

Still further, FIG. 7 shows a resilient, compressible dielectric seal gasket 212 compressed and engaging the flex circuit 150, the rigid dielectric support bracket 152 and the basedeck 104 to provide the bottom portion of the hermetically sealed internal environment for the HDA 102.

One of the conductive compression contacts 174 is shown in FIG. 8 in partial cut-away view as supported by the dielectric housing 166. The stepped deflection cavities 188 are disposed between the adjacent insulators 176. Each of the respective channels 186 is sized to surround and secure the main body portion 196, along with substantially twenty percent of the tail portion 198 of the respective conductive compression contact 174.

Returning to FIG. 4, one of the conductive compression contacts 174 is depicted with its pre-load spring contact 194 and tail portion 198. As noted above, the alignment pegs 168 are received into the alignment apertures 181 to properly dispose and align the electrical compression connector 159 into position during assembly. During assembly, the tail portion 198 of each of the conductive compression contacts 174 is soldered to one of the conductive traces 164 and the attachment member 170 is soldered to the attachment pad (not shown) on the PCB 160.

Generally, the conductive compression contacts 174 can be made from any metal conventionally used in the formation of such contacts, but preferably, the conductive compression contacts 174 are made from phosphor bronze, beryllium copper or a combination thereof. Preferably, the conductive compression contacts 174 are plated with a composition of tin, tin-lead, gold or combinations thereof.

When the disc drive 100 has been assembled, conductive surfaces 193 of the pre-load spring contacts 194 of the conductive compression contacts 174 conform to the conductors 162 of the flex circuit 150 (of the flex circuit and seal apparatus 148) to form continuous signal paths of uniform electrical characteristics by maintaining uniformity in capacitance and inductance of the signal paths over their entire length, thereby minimizing the parasitic electrical signal degradation effects created by changes in capacitance and inductance per unit length seen by the read/write signal along the signal path.

The present invention provides a low inductance electrical compression connector (such as 159) for conductors (such as 162) of a flex circuit (such as 150) to conductive traces (such as 164) on a printed circuit board (such as 160) of a disc drive (such as 100). The electrical compression connector has a dielectric housing (such as 166) with a plurality of spaced apart insulators (such as 176) extending from the dielectric housing. The insulators and the dielectric housing form open ended deflection cavities (such as 188) with the insulators forming the side walls and the dielectric housing forming the end of each deflection cavity. Conductive compression contacts (such as 174) are disposed between the insulator portions and supported by the dielectric housing, the conductive compression contacts having first and second ends extending from the dielectric housing. Each first end is solderable to a respective conductive trace on the printed circuit board while each second end is a pre-load spring contact (such as 194) disposable above a respective one of the deflection cavities.

When the electrical compression connector is attached to the printed circuit board each deflection cavity is disposed above the printed circuit board and when the flex circuit conductors are inserted adjacent the pre-load spring contacts, the pre-load spring contacts engage the conductors of the flex circuit to secure the flex circuit and provide electrical contact between the flex circuit and the printed circuit board.

It is to be understood that even though numerous characteristics and advantages of various embodiments of the present invention have been set forth in the foregoing description, together with details of the structure and function of various embodiments of the invention, this disclosure is illustrative only, and changes may be made in details especially in matters of structure and arrangement of parts within the principles of the present invention to the full extent indicated by the broad general meaning of the terms in which the appended claims are expressed.

What is claimed is:

1. An electrical compression connector for interconnecting conductors of a flex circuit to conductive traces on a printed circuit board of a disc drive to provide signal paths with substantially uniform capacitive and inductive electrical characteristics, the disc drive having a basedeck, the electrical compression connector comprising:

a dielectric housing comprising a housing body and a plurality of spaced apart insulator portions which extend from the housing body in a direction substantially parallel to the printed circuit board when the dielectric housing is affixed to the printed circuit board; and a plurality of conductive compression contacts supported by the dielectric housing, each conductive compression contact having a tail portion which projects from a first side of the housing body for connection to a respective one of the conductive traces on the printed circuit board, a main body portion which extends through the housing body in a direction substantially parallel to the printed circuit board, and a pre-load spring contact portion which projects from a second side of the housing body opposite the first side and between an adjacent pair of the spaced apart insulator portions to a distal point beyond the dielectric housing to pressingly engage a respective one of the conductors of the flex circuit when a distal end of the flex circuit extends adjacent the electrical compression connector in a direction substantially normal to the printed circuit board.

2. The electrical compression connector of claim 1 wherein the printed circuit board has an attachment pad, the dielectric housing comprises an attachment tab, and wherein the attachment tab comprises an attachment member solderable to the attachment pad for attaching the dielectric housing to the printed circuit board.

3. The electrical compression connector of claim 2 further comprising a second attachment tab supported by the dielectric housing disposed to attach the dielectric housing and the printed circuit board to the basedeck.

4. The electrical compression connector of claim 3 wherein the second attachment tab has a mounting aperture, and wherein the electrical compression connector further comprises a fastener extendable through the mounting aperture for attaching the dielectric housing to the printed circuit board and to the basedeck.

5. The electrical compression connector of claim 1 wherein the dielectric housing has at least one alignment peg extending therefrom, and wherein the printed circuit board has a corresponding alignment aperture, the alignment peg receivable in the alignment aperture for aligning the electrical compression connector on the printed circuit board.

6. The electrical compression connector of claim 5 wherein each conductive compression contact has a conductive surface conformable to a respective one of the conductors of the flex circuit.

7. The electrical compression connector of claim 6 wherein the conductive compression contacts are made from metal selected from a group consisting of phosphor bronze and beryllium copper.

8. The electrical compression connector of claim 7 wherein the surfaces of the conductive compression contacts have a plating selected from a group consisting of tin, tin-lead and gold.

9. A disc drive, comprising:

a head disc assembly comprising a housing which supports a rotatable disc, an actuator assembly adjacent the disc and a flex circuit which is affixed to the actuator assembly, the flex circuit comprising a plurality of conductors and a distal end which extends through the housing;

a printed circuit board, mounted to an exterior surface of the housing, comprising circuit components and a plurality of conductive traces which conduct electrical signals to the circuit components; and an electrical compression connector affixed to the printed circuit board which interconnects the conductors of the flex circuit with the conductive traces of the printed circuit board to provide signal paths with substantially uniform capacitive and inductive electrical characteristics, comprising:

a dielectric housing comprising a housing body and a plurality of spaced apart insulator portions which extend from the housing body in a direction substantially parallel to the printed circuit board;

a plurality of conductive compression contacts supported by the dielectric housing, each conductive compression contact having a tail portion which projects from a first side of the housing body for connection to a respective one of the conductive traces on the printed circuit board, a main body portion which extends through the housing body in a direction substantially parallel to the printed circuit board, and a pre-load spring contact portion which projects from a second side of the housing body opposite the first side and between an adjacent pair of the spaced apart insulator portions to a distal point beyond the dielectric housing to pressingly engage a respective one of the conductors of the flex circuit when the distal end of the flex circuit extends adjacent the electrical compression connector in a direction substantially normal to the printed circuit board.

10. The disc drive of claim 9 wherein the printed circuit board comprises an attachment pad, wherein the dielectric housing comprises an attachment tab, and wherein the attachment tab has an attachment member solderable to the attachment pad for attaching the dielectric housing to the printed circuit board.

11. The disc drive of claim 10 further comprising a second attachment tab supported by the dielectric housing disposed to attach the dielectric housing to the printed circuit board and the basedeck.

12. The disc drive of claim 11 wherein the second attachment tab has a mounting aperture, and wherein the electric compression connector comprises a fastener extendable through the mounting aperture for attaching the dielectric housing and the printed circuit board to the basedeck.

13. The disc drive of claim 12 wherein the conductive compression contacts are made from metal selected from a group consisting of phosphor bronze and beryllium copper, the surfaces of the metal conductive contact further having a plating selected from a group consisting of tin, tin-lead and gold.

14. The disc drive of claim 9 wherein the dielectric housing has at least one alignment peg extending therefrom, and wherein the printed circuit board has a corresponding alignment aperture, the alignment peg receivable in the alignment aperture for aligning the electrical compression connector on the printed circuit board.

15. The electrical compression connector of claim 1 wherein the housing body of the dielectric housing comprises first and second portions respectively disposed on opposing sides of the main body portions of the conductive compression contacts and which cooperate to form a stepped recess between each adjacent pair of the spaced apart insulator portions so that the first portion of the housing body contacts the printed circuit board and has a first length dimension parallel to the main body portions, and the second portion of the housing body has a second length dimension parallel to the main body portions greater than the first length dimension, and wherein the main body portions abut the second portion.

16. The disc drive of claim 9 wherein the housing body of the dielectric housing comprises first and second portions respectively disposed on opposing sides of the main body portions of the conductive compression contacts and which cooperate to form a stepped recess between each adjacent pair of the spaced apart insulator portions so that the first portion of the housing body contacts the printed circuit board and has a first length dimension parallel to the main body portions, and the second portion of the housing body has a second length dimension parallel to the main body portions greater than the first length dimension, and wherein the main body portions abut the second portion.

* * * * *